US008680671B2

(12) United States Patent
Hsieh

(10) Patent No.: US 8,680,671 B2
(45) Date of Patent: Mar. 25, 2014

(54) SELF-ALIGNED DOUBLE PATTERNING FOR MEMORY AND OTHER MICROELECTRONIC DEVICES

(75) Inventor: Tzu-Yen Hsieh, Saratoga, CA (US)

(73) Assignee: Spansion LLC, Sunnyvale, CA (US)

( * ) Notice: Subject to any disclaimer, the term of this patent is extended or adjusted under 35 U.S.C. 154(b) by 509 days.

(21) Appl. No.: 12/322,105

(22) Filed: Jan. 28, 2009

(65) Prior Publication Data
US 2010/0187596 A1 Jul. 29, 2010

(51) Int. Cl.
*H01L 21/302* (2006.01)
(52) U.S. Cl.
USPC .......... 257/708; 257/709; 257/E21.206; 430/313; 430/316
(58) Field of Classification Search
USPC .......... 438/709; 257/E21.026; 430/313, 316
See application file for complete search history.

(56) References Cited

U.S. PATENT DOCUMENTS

| | | | |
|---|---|---|---|
| 5,328,810 A * | 7/1994 | Lowrey et al. | 430/313 |
| 6,867,116 B1 * | 3/2005 | Chung | 438/551 |
| 6,887,627 B2 * | 5/2005 | Chung et al. | 430/5 |
| 7,235,478 B2 | 6/2007 | Geng et al. | |
| 7,324,374 B2 | 1/2008 | Shieh et al. | |
| 7,385,851 B1 | 6/2008 | Park et al. | |
| 2006/0008989 A1 * | 1/2006 | Chen et al. | 438/257 |
| 2008/0175054 A1 | 7/2008 | Hancock et al. | |

OTHER PUBLICATIONS

Definition of spacer: http://www.credoreference.com/entry/apdst/spacer.*

* cited by examiner

*Primary Examiner* — Amar Movva
(74) *Attorney, Agent, or Firm* — Sterne, Kessler, Goldstein & Fox P.L.L.C.

(57) ABSTRACT

A method for transferring a pattern to one or more microelectronic layers. A first mask layer, having a patterned feature, and a second mask layer, having another patterned feature, are formed. The first mask layer and the second mask layer are at least partially covered with a film, and openings are formed in the film by removing the other patterned feature of the second mask layer. A pattern of a microelectronic layer is then defined by patterning the patterned feature of the first mask layer through the openings in the film. In one example, the patterned feature of the first mask layer is defined by forming spacers adjacent to the other patterned feature. In another example, the other patterned feature of the second mask layer is defined by removing a portion of the other patterned feature via an anisotropic etching process.

17 Claims, 11 Drawing Sheets

US 8,680,671 B2

SELF-ALIGNED DOUBLE PATTERNING FOR MEMORY AND OTHER MICROELECTRONIC DEVICES

FIELD OF THE INVENTION

The invention is related to a method of manufacturing a microelectronic device, and in particular but not exclusively, to a method of patterning features of such a device.

BACKGROUND OF THE INVENTION

A memory, such as a random access memory (RAM) or read only memory (ROM) often includes arrayed memory cells. Typically, each of the memory cells is coupled to at least one bit line and an overlapping word line, and each of the memory cells include a memory element that is configured to store a logic state. In operation, a controller reads from and/or writes to an individual memory element by receiving and transmitting signals over the bit and word lines of the memory.

Typically, memory cells are small and closely spaced, with some memory cells having feature sizes and inter-cell spacing on the orders of 50 nm or less. As memories become smaller, however, it becomes increasingly difficult to manufacture smaller and more closely spaced memory cells.

BRIEF DESCRIPTION OF THE DRAWINGS

Non-limiting and non-exhaustive embodiments of the invention are described with reference to the following drawings, in which.

DETAILED DESCRIPTION

Figure 1:
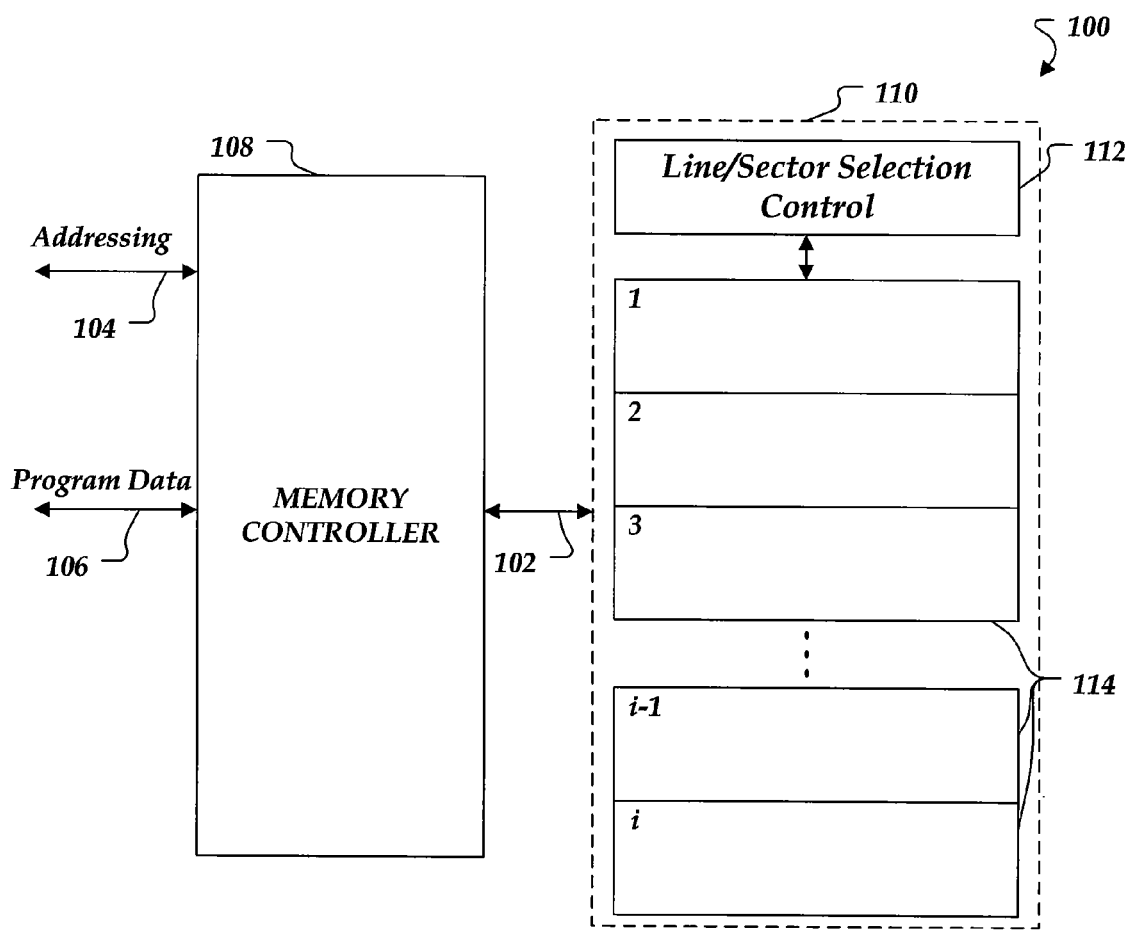
FIG. 1 is a block diagram of an embodiment of a memory controller and an arrayed memory.

Various embodiments of the invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take the meanings explicitly associated herein, unless the context clearly dictates otherwise. The phrase "in one embodiment" as used herein does not necessarily refer to the same embodiment, though it may. Furthermore, the phrase "in another embodiment" as used herein does not necessarily refer to a different embodiment, although it may. Thus, as described below, various embodiments of the invention may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

As used herein the term microelectronic layer includes a layer of microelectronic material employed in one or more microelectronic devices or systems thereof. For example, microelectronic materials can include group IV semiconductor materials or compound semiconductor materials. Group IV materials include, for example, silicon, germanium, or the like. Compound semiconductor materials include, for example, Gallium Arsenide, Indium Phosphide, or the like. Microelectronic materials can also include polysilicon (or amorphous silicon), silicon oxide, silicon nitride, silicide, ceramics (e.g., silicon nitride or silicon carbide), and/or metals or metal alloys (e.g., aluminum, copper, aluminum-copper, gold, titanium, tungsten, or cobalt). As used herein the term "substrate" may include a structure of one or more microelectronic materials in which microelectronic devices and other components of a memory may be formed in and/or upon. Further, although primarily discussed herein in the context of silicon-based microelectronic layers and substrates, other embodiments of microelectronic layers and substrates may be employed.

As used herein the term "feature" is used to refer to a structure that is formed in a substrate, one or more microelectronic layers, and/or one or more other layers, including photoresist layers or other mask layers. As used herein, the term "pitch" refers to a linear length of a feature (or width) combined with a linear length of a spacing between the feature and another feature. Also, in many embodiments, a pitch is associated with a portion of pattern that is repeated, such as a repeated line and spacing or the like. As used herein the terms "define", "defined", or "defining" refer to a process associated with patterning, etching, and/or otherwise forming a size, shape, and/or a portion of a shape associated with a feature, opening, recess, or other aspect of a substrate, microelectronic layer, and/or other layer.

Briefly stated, the invention is related to a method for transferring a pattern to one or more microelectronic layers, such as layers in a memory or other microelectronic devices. A first mask layer, having a patterned feature, and a second mask layer, having another patterned feature, are formed. The first mask layer and the second mask layer are at least partially covered with a film, and openings are formed in the film by removing the other patterned feature of the second mask layer. A pattern of a microelectronic layer is then defined by patterning the patterned feature of the first mask layer through the openings in the film.

In one embodiment, the patterned feature of the first mask layer is defined by forming spacers that have a height corresponding to a combined thickness of the second mask layer and a photoresist layer. In another embodiment, the other patterned feature of the second mask layer is defined by removing a portion of the other patterned feature of the second mask layer via an anisotropic etching process.

In some embodiments, the invention may be employed to reduce a pitch associated with features in one or more microelectronic devices. For example, the invention may be employed to reduce the pitch associated with an array of memory cells in a flash-based memory. In one embodiment, the invention may be employed to enhance a pitch associated with a photoresist mask layer. In such an embodiment, the pitch can be reduced without requiring a change in lithographic technology. For example, a next generation resolution can be realized with a current generation technology and potentially without requiring an expensive investment in a next generation technology, including next generation lithographic development tools and/or chemistries. Also, in one embodiment, pitch can be reduced while still benefiting from the patterning techniques of current generation technology. For example, the patterning techniques of next generation technology typically provide less robust photoresist mask layers due to smaller critical dimension sizes (e.g. the etch rate selectively is less and/or the mask layer is required to be thinner).

FIG. 1 shows a memory environment in which embodiments of the invention may be employed. Not all the components illustrated in the figures may be required to practice the invention, and variations in the arrangement and type of the components may be made without departing from the spirit or scope of the invention.

As shown, memory 100 includes arrayed memory 110 and memory controller 108. Arrayed memory 110 is arranged to receive and/or transmit signals over signal/bus lines 102. Arrayed memory 110 includes line/sector control circuit 112 and memory sectors 114 (identified individually as sectors 1-i). Memory sectors 114 can include, for example, 256, 512, 1024, or more sectors having memory cells that can be individually or collectively accessed via line/sector control circuit 112. In other examples, the number and/or arrangement of memory sectors can be different. In one embodiment, for example, sectors 114 can be referred to more generally as memory blocks, and line/sector control circuit 112 can be configured to have a configuration that is different than a bit line, word line, source gate line, and/or sector topology.

Memory controller 108 is arranged to receive and transmit data from an upstream system controller (not shown) via addressing signal/bus line 104 and program data signal/bus line 106. Memory controller 108 can include any of a variety of decoder circuits, voltage generator circuits, and/or controller circuits. In one embodiment, memory controller 108 may be located on the same chip as arrayed memory 110. In another embodiment, memory controller 108 may be located on a different chip, or portions of memory controller 108 may be located on another chip or off chip. In other examples, other implementations of memory controller 108 are possible. For example, memory controller 108 can include a programmable microcontroller.

In one embodiment, memory 100 is a flash based memory including flash-based memory cells, such as flash-based NAND cells, NOR cells, or hybrids of the two. In other embodiments, memory 100 may be another type of volatile or non-volatile memory, including, for example, a static random access memory (SRAM) or a dynamic random access memory (DRAM).

Figure 2:
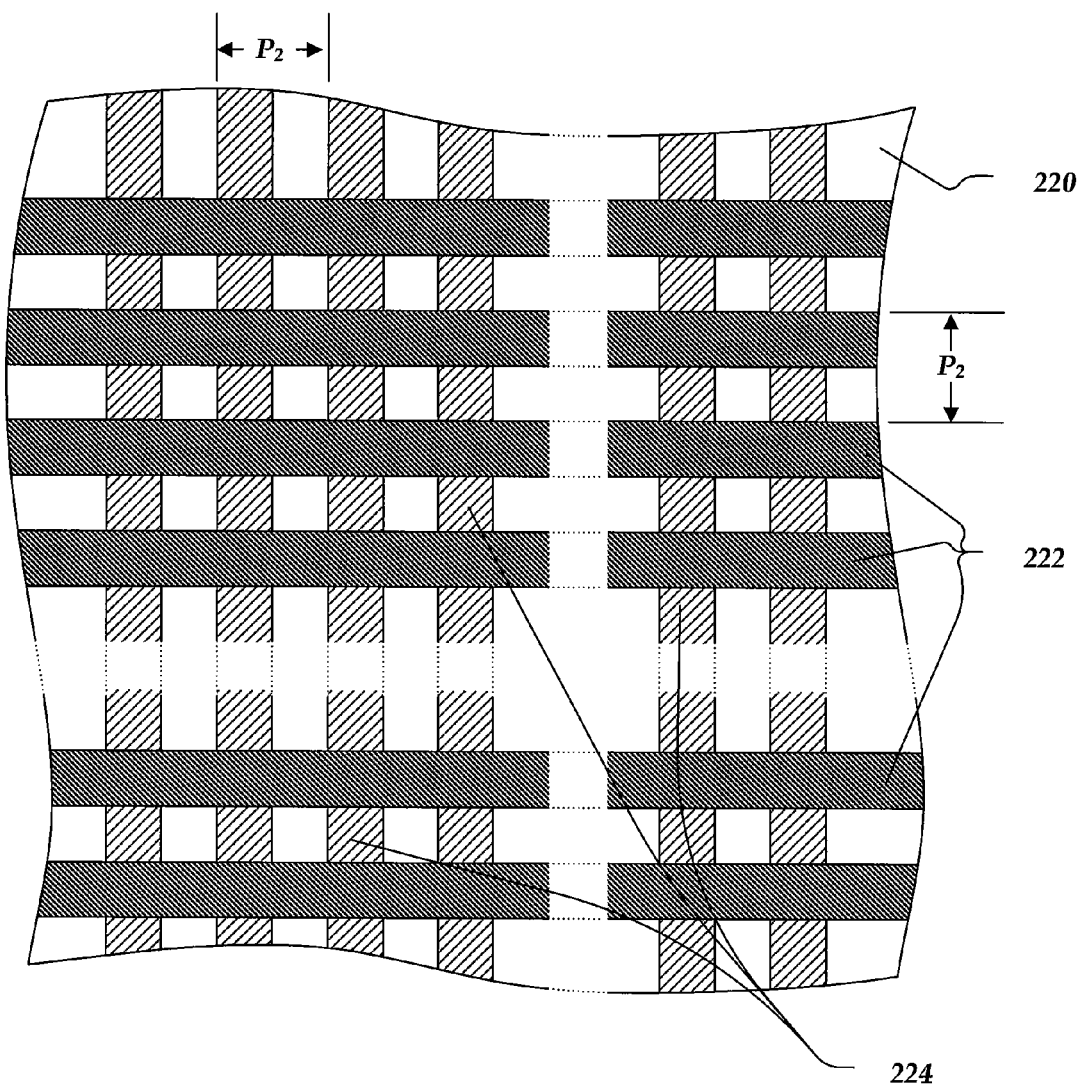
FIG. 2 is a partial top plan view of an embodiment of a patterned microelectronic lines that may be employed in the arrayed memory of FIG. 1.

FIG. 2 shows a partial top plan view of an embodiment of patterned microelectronic lines that may be formed on or within a portion of substrate 220. In one embodiment, substrate 220 may form a portion of a semiconductor chip that is employed in memory 100 of FIG. 1.

Microelectronic lines 222 are features that may be located on and/or within substrate 220 and may be adjacent to one or more other features 224. In one embodiment, microelectronic lines 222 are located on substrate 220; for example, microelectronic lines 222 may be formed by a deposition process. In another embodiment, microelectronic lines 222 may include any of a variety be formed within substrate; for example, microelectronic lines 222 may be etched into substrate 220.

As shown in FIG. 2, individual microelectronic lines 222 have an associated pitch $P_2$. In another embodiment, individual features 224 have an associated pitch $P_2$. In one embodiment, pitch $P_2$ is in a range of about 20 to about 50 nm. In other embodiments, however, pitch $P_2$ may be less than 20 nm or greater than 50 nm. Also, while shown in FIG. 2 as having the same value of pitch, embodiments of microelectronic lines 222 and features 224 can have different pitch values.

In another embodiment, microelectronic lines 222 may be employed in an embodiment of memory sector 114 of FIG. 1. For example, microelectronic lines 222 may be polysilicon word lines and/or polysilicon gate source lines that are coupled to the gates of individual memory cells (not shown in FIG. 2) located within substrate 220. In some embodiments, microelectronic lines 222 can be arranged in a NAND configuration, a NOR configuration, a hybrid of a NAND and NOR configuration, or a different configuration. In general, pitch $P_2$ is larger in NOR topologies than it is in NAND topologies.

Figure 3:
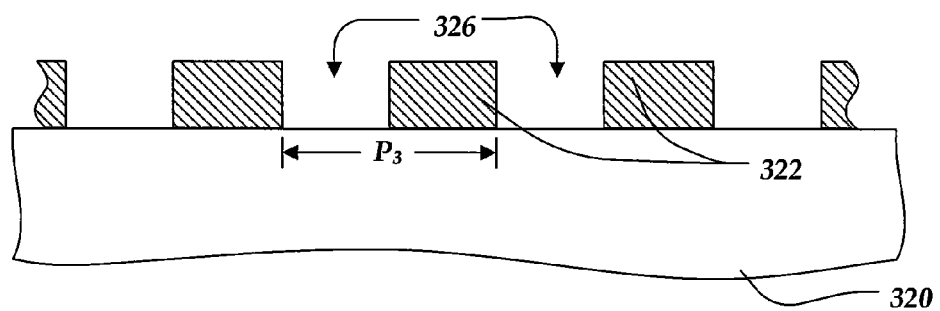
FIG. 3 is a cross-sectional side view of an embodiment of a patterned microelectronic layer that may be employed in an embodiment of the patterned microelectronic lines of FIG. 2.

FIG. 3 shows a cross-sectional side view of an embodiment of microelectronic layer 332 and substrate 320. Microelectronic layer 322 and substrate 320 may be employed in an embodiment of an individual one of microelectronic lines 222 and substrate 220 of FIG. 2, respectively. As shown, microelectronic layer 332 includes patterned openings 326 having pitch $P_3$. In one embodiment, pitch $P_3$ is an embodiment of pitch $P_2$ of FIG. 2.

Figure 4:
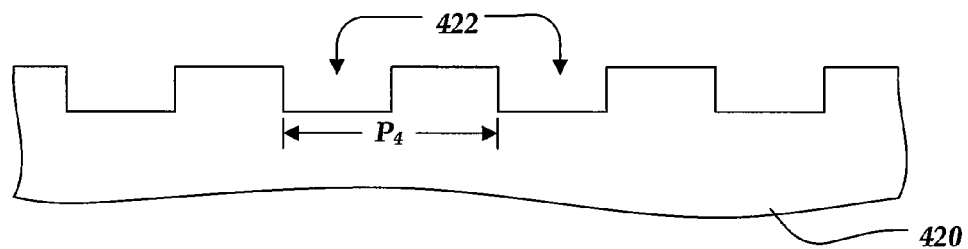
FIG. 4 is a cross-sectional side view of an embodiment of patterned recesses that may be employed in another embodiment of the patterned microelectronic lines of FIG. 2.

FIG. 4 shows a cross-sectional side view of an embodiment of recesses 422 in substrate 420. In one embodiment, recesses 422 and substrate 420 may be employed in an embodiment of an individual one of microelectronic lines 222 and substrate 220 of FIG. 2, respectively. As shown, recesses 422 have an associated pitch $P_4$. In one embodiment, pitch $P_4$ is an embodiment of pitch $P_2$ of FIG. 2.

Figure 5:
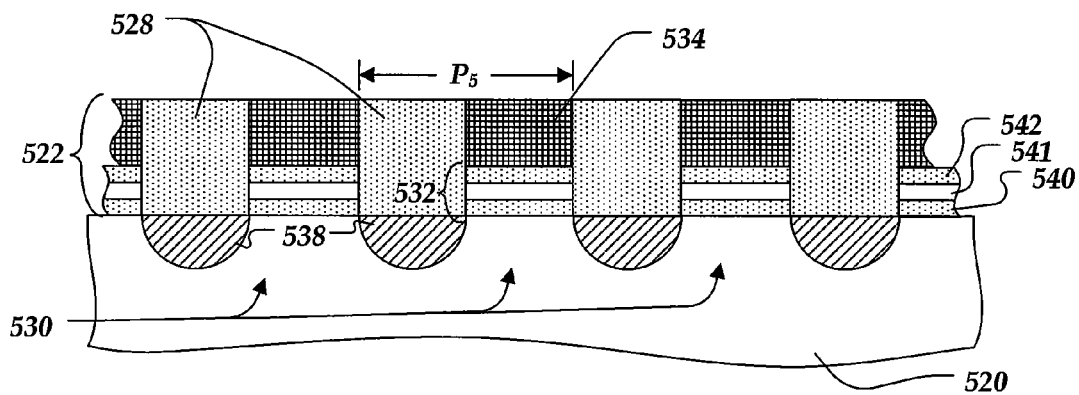
FIG. 5 is a cross-sectional side view of an embodiment of a patterned layered stack that may be employed in yet another embodiment of the patterned microelectronic lines of FIG. 2.

FIG. 5 shows a cross-sectional side view of an embodiment of layered stack 522 and substrate 520. In one embodiment, layered stack 522 and substrate 520 may be employed in an embodiment of an individual one of microelectronic lines 222 and substrate 220 of FIG. 2, respectively. As shown, dielectric spacers 528, having pitch $P_5$, separate portions of layered stack 522. In one embodiment, pitch $P_5$ is an embodiment of pitch $P_2$ of FIG. 2. In another embodiment, dielectric spacer 528 are an embodiment of features 224 of FIG. 2.

In one embodiment, layered stack 522 and dielectric spacers 528 define locations of individual memory cells 530. Each of memory cells 530 includes a charge trapping component 532 that is located in layered stack 522. In addition, each of memory cells 530 can be coupled to a portion of polysilicon line 534, which is also located in layered stack 522. Individual memory cells 530 are configured to share source/drain regions 538 formed in substrate 520.

Charge trapping component 532 includes tunneling layer 540, charge trapping layer 541, and dielectric layer 542. In general, tunneling layer 540 provides a tunneling barrier. Charge trapping layer 541 may be a non-conductive layer that is configured to store a tunneled charge. Dielectric layer 542 electrically isolates charge trapping layer 541 from polysilicon line 534.

In operation, polysilicon line 534 and source/drain regions 538 are configured to provide electrical potentials for trapping charge within a charge trapping component. One or more portions of charge trapping component are "programmed" when trapping charge and "unprogrammed" when not trapping charge. Although generally described in the context of a dual-bit or multi-bit topology, the invention is not so limited, and other embodiments of memory cells may be manufactured using the manufacturing techniques described herein. Further, embodiments of the invention can be employed to manufacture other types of devices, including other types of electrical devices, such as a capacitor, transistor, or the like; mechanical devices; as well as other types of electro-mechanical devices.

Figure 6:
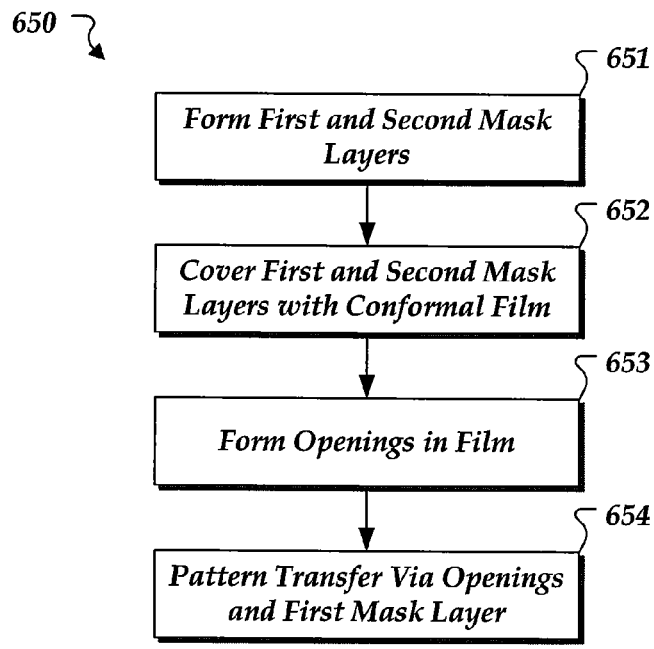
FIG. 6 is a flow diagram generally showing an embodiment of a process for transferring a pattern to one or more microelectronic layers.

FIG. 6 is a flow diagram generally showing one embodiment of process 650 for transferring a self-aligned pattern to one or more microelectronic layers. In one embodiment, process 650 is employed to form microelectronic lines 222 of FIG. 2.

Process 650 begins at block 651, where a first mask layer is formed, and a second mask layer is formed on the first mask layer. The first mask layer includes a first patterned feature and the second mask layer includes a second patterned feature that is located on the first patterned feature of the first mask layer. In one embodiment, the first patterned feature of the first mask layer is defined by spacers having a height corresponding to a combined thickness of the second mask layer and the photoresist mask layer (described further with reference to FIGS. 10-16). In another embodiment, the second patterned feature of the second mask layer is defined by removing a portion of the second patterned feature of the second mask layer that is covered by a photoresist mask layer (described further with reference to FIGS. 17-19).

Processing continues to block 652, where the first mask layer and the second mask layer are at least partially covered by a film. In one embodiment, the film is a microelectronic layer that is deposited in a thin film deposition process. Thin film deposition processes can include, for example, chemical vapor deposition (CVD), physical vapor deposition (PVD), plasma enhanced CVD (PECVD), atomic layer deposition (ALD), or the like. In one embodiment, the film includes a high density plasma (HDP) oxide. In another embodiment, the isolation dielectrics include a tetra-ethyl-ortho-silicate (TEOS) oxide or an ozone based TEOS. In another embodiment, a chemical mechanical polishing (CMP) process can planarize a conformal film such that a surface of the second patterned second of the second mask layer is exposed through the conformal film. For example, a CMP process can be employed to recess the conformal film below such a surface. In another embodiment, a non-conformal film includes a photoresist (PR) film, such as a spin-on or deposited photoresist film or other film. For example, a non-conformal film can include spin-on-carbon or spin-on-silicon to enhance wet etch resistance. In yet another embodiment, a conformal or non-conformal film includes another type of polymeric material.

Processing continues to block 653, where openings are formed in the film by removing the second patterned feature of the second mask layer. In one embodiment, an etching process may be employed to remove the second patterned feature. The etching processes can include, for example, one or more wet and/or dry etch techniques, including chemical and/or physical etching techniques, employing, for example, isotropic or anisotropic wet and/or dry etch chemistries, reactive ion etches, and/or plasma assisted etches. In general, the type of chemistry employed in the etching process may be based on the material of the first and second mask layers. For example, hydrofluoric chemistries can be employed to selectively etch silicon oxide over silicon, polysilicon, silicon nitride, or the like.

In one embodiment, surfaces of the second pattern feature may be exposed through the film prior to removal. In one embodiment, as discussed above, a CMP process, or the like may be employed to recess the film. In another embodiment, an etch back process can be used to thin the film. For example, a blanket etch can thin a film to expose a surface portion of the second patterned feature. In another example, a bottom anti-reflective coating (BARC) etch back process can be employed to thin a conformal photoresist mask.

Processing continues to block 654, where a pattern is defined in a microelectronic layer by patterning the patterned feature of the first mask layer through the openings in the film. An etching process, for example, may be employed to define a combined pattern that includes the first patterned feature of the first mask layer and the second patterned feature of the second mask layer transferred into the first patterned feature. In another embodiment, the same etching process or a different etching process may be employed to transfer the combined pattern into a microelectronic layer. For example, the film may be removed, and an etching process may form the combined pattern in a microelectronic layer positioned beneath the first mask layer.

Although not illustrated, processing may continue to form devices or other features. For example, processing may continue to form a memory, such as memory 100 of FIG. 1, or a portion of the memory. Further, such devices or features may be cleaved to form individual dies or chips that may be incorporated into a packaged device or other device. A person skilled in the art would appreciate the various manners in which such processing and packaging may be carried out.

Moreover, a variety of simulation and/or software tools may be employed to create a specific implementation of the first patterned feature of the first mask layer and the second patterned feature of the second mask layer. For example, the feature sizes of the first mask layer and the second mask layer can be designed to create a specific pitch or spacing for a combined pattern. High-level software code, such as a register transfer logic (RTL) file, may be created and then compiled to form a netlist file. The netlist file may be used in turn to optimize the combined pattern. A physical design process may be employed in conjunction with the netlist file and a component library to create a layout file. The layout file may be used to create a mask file that may be provided to a device foundry to equip the foundry for manufacturing a one or more microelectronic layers containing the combined pattern.

Further, although not described with reference to the figures, any of a variety of intermediary processes may be employed between individual blocks of process 650, such as cleaning, metrology, inspection, and/or other processes. For example, a variety of wet cleaning and/or dry cleaning processes may be used to prepare a substrate or remove a mask layer.

FIGS. 7-10 illustrate various embodiments of stages corresponding to the manufacture of a patterned microelectronic line or feature. In one embodiment, the various stages represent stages of manufacturing microelectronic lines 222 of FIG. 2.

Figure 7:
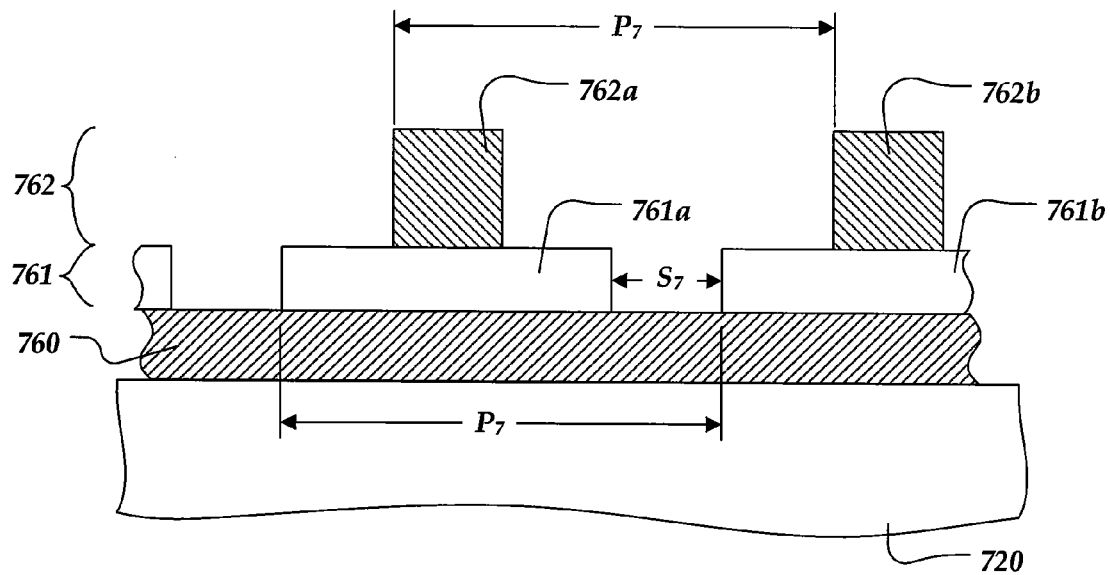
FIGS. 7-10 illustrate embodiments of stages corresponding to the process of FIG. 5.

FIG. 7 is an embodiment showing a cross-sectional side view of substrate 720; microelectronic layer 760; first mask layer 761 having, at least, first patterned features 761*a* and 761*b*; and second mask layer 762 having, at least, second patterned features 762*a* and 762*b*. In one embodiment, first mask layer 761 includes a silicon nitride material or a silicon-oxy-nitride material. Second mask layer 762 may include a polysilicon material. In another embodiment, one or more of first mask layer 761 and second mask layer 762 includes a combination of different microelectronic materials.

In one embodiment, the patterned features of second mask layer 762 have pitch $P_7$ that is at least twice as large as pitch $P_2$ of FIG. 2. In another embodiment, the patterned features of first mask layer 761 are separated by spacing distance $S_7$ to define a portion of pitch $P_2$ of FIG. 2. In yet another embodiment, the patterned features of first mask layer 761 have pitch $P_7$. In one embodiment, the cross-sectional side view of FIG. 7 corresponds to processing associated with block 651 of process 650 of FIG. 6.

Figure 8:
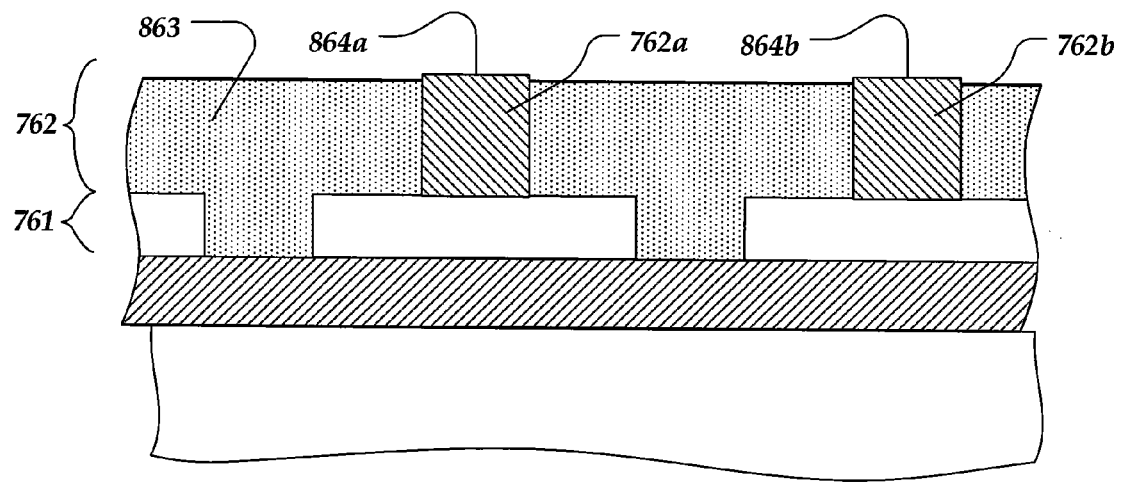

FIG. 8 is an embodiment showing a cross-sectional side view of film 863 covering portions of first mask layer 761 and second mask layer 762. As shown, portions of patterned features 762*a* and 762*b* project beyond film 863, exposing surface portions 864*a* and 864*b* of patterned features. 762*a* and 762*b*, respectively. In one embodiment, the cross-sectional side view of FIG. 8 corresponds to processing associated with block 652 of process 650 of FIG. 6.

Figure 9:
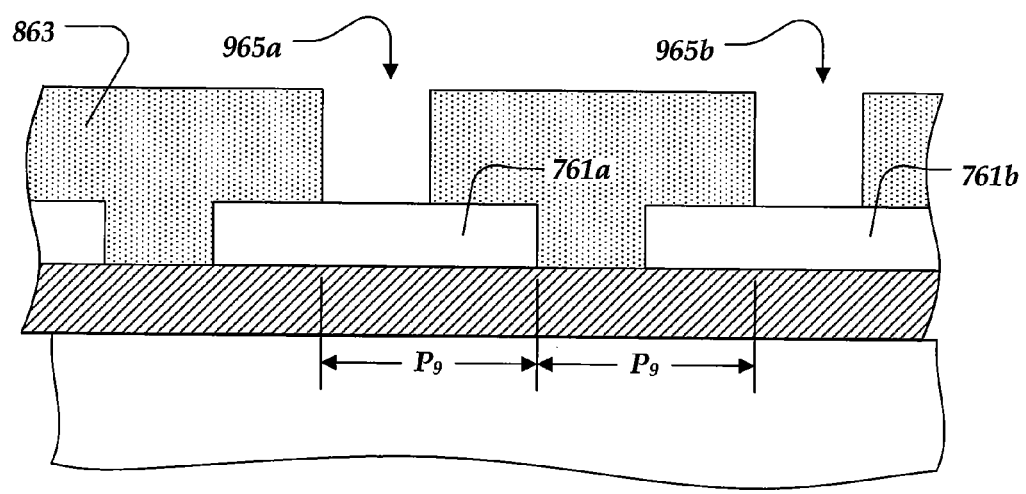

FIG. 9 is an embodiment showing a cross-sectional side view of openings 965*a* and 965*b* defined in film 863 after removing patterned features 762*a* and 762*b*. Openings 965*a* and 965*b* and first patterned features 761*a* and 761*b* define pitch $P_9$. In one embodiment, pitch $P_9$ is an embodiment of Pitch $P_2$ of FIG. 2. In one embodiment, the cross-sectional side view of FIG. 9 corresponds to processing associated with block 653 of process 650 of FIG. 6.

Figure 10:
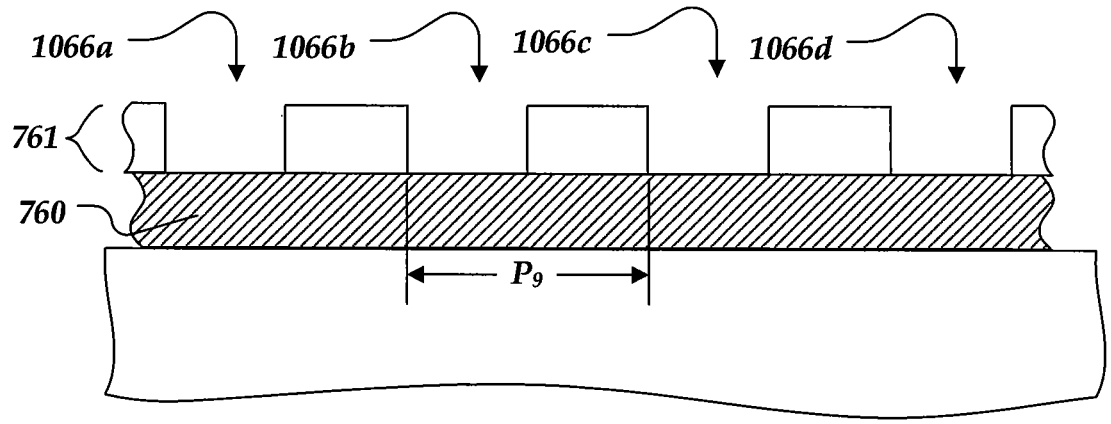

FIG. 10 is an embodiment showing a cross-sectional side view of patterned features 1066*a-d* defined in first mask layer 761 and having pitch $P_9$ of FIG. 9. In one embodiment, the cross-sectional side view of FIG. 10 corresponds to processing associated with block 654 of process 650 of FIG. 6.

Although not illustrated, processing may continue beyond that described in conjunction with FIG. 6. In one embodiment, another etching process may be employed to transfer a pattern associated with patterned features 1066*a-d* into microelectronic layer 760. For example, microelectronic layer 760 of FIG. 10 may be patterned to form microelectronic lines 222 of FIG. 2. In another embodiment, first mask layer 761 is an embodiment of an individual one of microelectronic lines 222.

Figure 11:
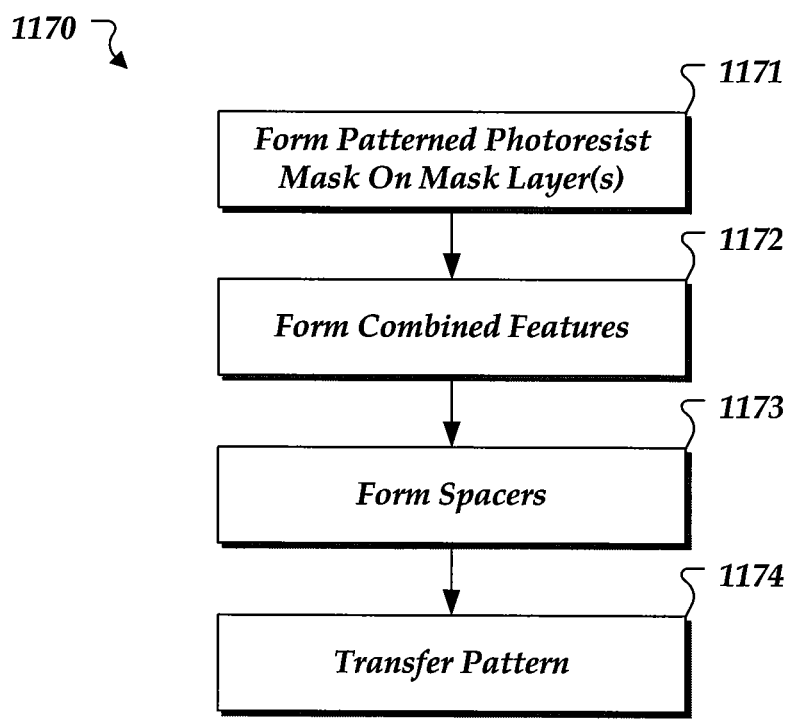
FIG. 11 is a flow diagram generally showing an embodiment of a process for self-aligned patterning one or more microelectronic layers.

FIG. 11 is a flow diagram generally showing an embodiment of a process for self-aligned patterning of one or more microelectronic layers. Process 1170 may be an embodiment of one or more manufacturing steps that are carried out at block 651 of process 650 of FIG. 6.

Process 1170 begins at block 1171, where a patterned photoresist mask is formed on a hard mask. For example, in one embodiment, a patterned photoresist mask can be formed on second mask layer 762 of FIG. 7 (prior to forming features 762*a* and 762*b*). In general, the patterning processes can include any of a wide variety of combinations of photolithographic and/or etching processes. Photolithographic process can include, for example, single- or multi-step photolithographic techniques employing one or more photoresist masks, such as a photolithographic mask including UV or deep UV light sensitive materials and optionally BARC layers. In one embodiment, the patterned features of the photoresist mask may be thinned by an oxygen plasma. In another embodiment, such a thinning process may reduce the feature size of the patterned photoresist mask by an order of 1.25, 1.5, 1.75, 2, or more. In another embodiment, a hard mask or the like may be used in lieu of or in addition to a photoresist mask layer.

Processing continues to block 1172, where combined features are formed in the photoresist mask and the hard mask such that the combined features each include a first section of the photoresist mask and a second section of the hard mask. In one embodiment, one or more etching processes may be employed to form the combined features.

Processing continues to block 1173, where spacers are formed adjacent to the combined features such that each spacer is adjacent to a first section of the combined feature and a second section of the combined feature. In one embodiment, the spacers are formed by depositing a polymeric material and etching back the polymeric material. For example, the spacers may be formed using a Motif™ post-lithography pattern enhancement system (available from LAM Research Corp., Freemont, Calif.). In another embodiment, a Motif™ system can also be employed for resist shrinking carried out at block 1150.

Processing continues to block 1174, where a first pattern is transferred to a microelectronic layer using the combined features and the spacers formed at block 1173 as an etch mask. In one embodiment, an etching process is used to define the first pattern in the microelectronic layer. In another embodiment, the first pattern is formed in first mask layer 761 of FIG. 7. In yet another embodiment, the first pattern is formed in a different microelectronic layer.

Upon completion of block 1174, processing may continue. For example, in one embodiment, processing may continue to block 652 of FIG. 6.

FIGS. 12-16 illustrate various embodiments of stages corresponding to the manufacture of a patterned microelectronic line or feature. In one embodiment, the various stages represent stages of manufacturing microelectronic lines 222 of FIG. 2.

Figure 12:
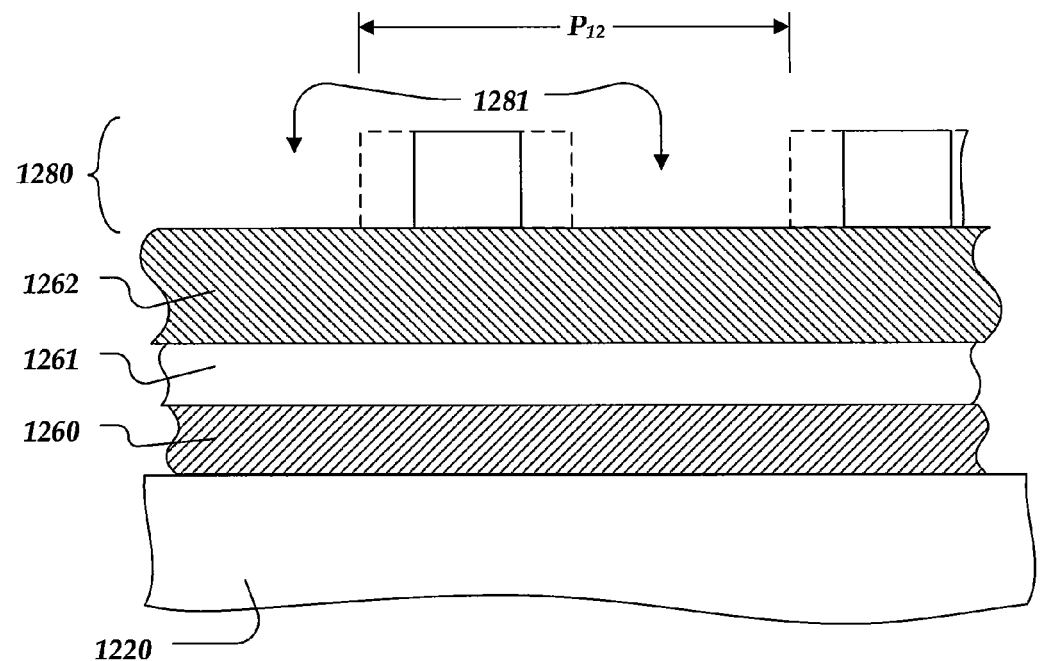
FIGS. 12-16 illustrate embodiments of stages corresponding to the process of FIG. 10.

FIG. 12 is an embodiment showing a cross-sectional side view of substrate 1220, microelectronic layer 1260, first mask layer 1261, second mask layer 1262, and photoresist mask layer 1280 having openings 1281 with associated pitch $P_{12}$. In one embodiment, portions of photoresist (drawn in dashed lines) mask layer can be removed by a photoresist thinning process.

In one embodiment, substrate 1220, microelectronic layer 1260, first mask layer 1261, and second mask layer 1262 of FIG. 12 are an embodiment of substrate 720, microelectronic layer 760, first mask layer 761, and second mask layer 762 of FIG. 7, respectively. In another embodiment, pitch $P_{12}$ is an embodiment of pitch $P_7$ of FIG. 7. In one embodiment, the cross-sectional side view of FIG. 12 corresponds to processing associated with block 1171 of process 1170 of FIG. 11.

Figure 13:
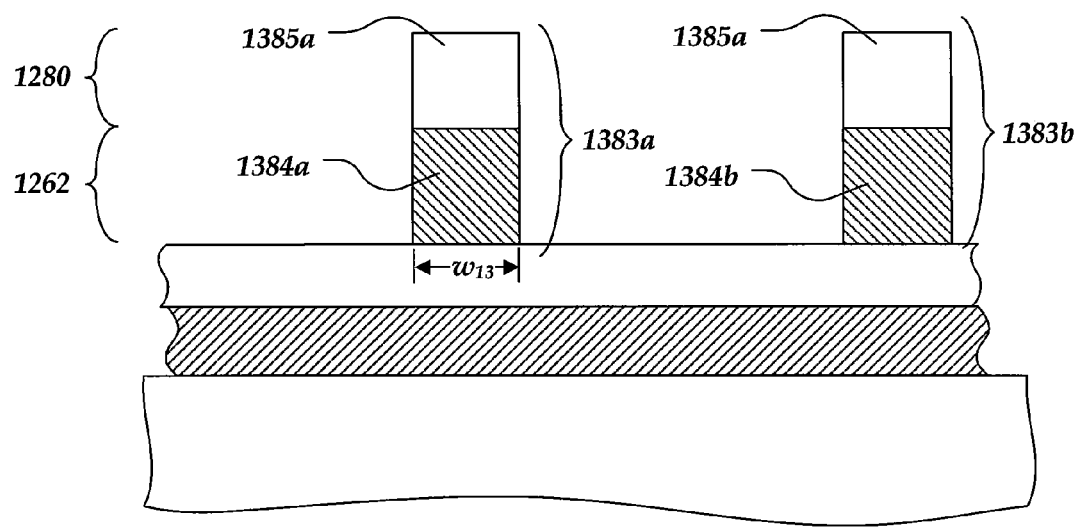

FIG. 13 is an embodiment showing a cross-sectional side view of combined features 1383*a* and 1383*b* each having a corresponding minimum width $w_{13}$ and including a section of photoresist mask 1280 and a section of second mask layer 1262. Combined feature 1383*a* includes first section 1384*a* of second mask layer 1262 and second section 1385*a* of photoresist mask layer 1280. Combined feature 1383*b* includes first section 1384*b* of second mask layer 1262 and second section 1385*b* of photoresist mask layer 1380. In one embodiment, the cross-sectional side view of FIG. 13 corresponds to processing associated with block 1172 of process 1170 of FIG.

11. In one embodiment, width $w_{13}$ has a value that is in range of about 10 to 30 nm. In other embodiments, however, width $w_{13}$ has a value that is less than or greater than the values in this range.

Figure 14:
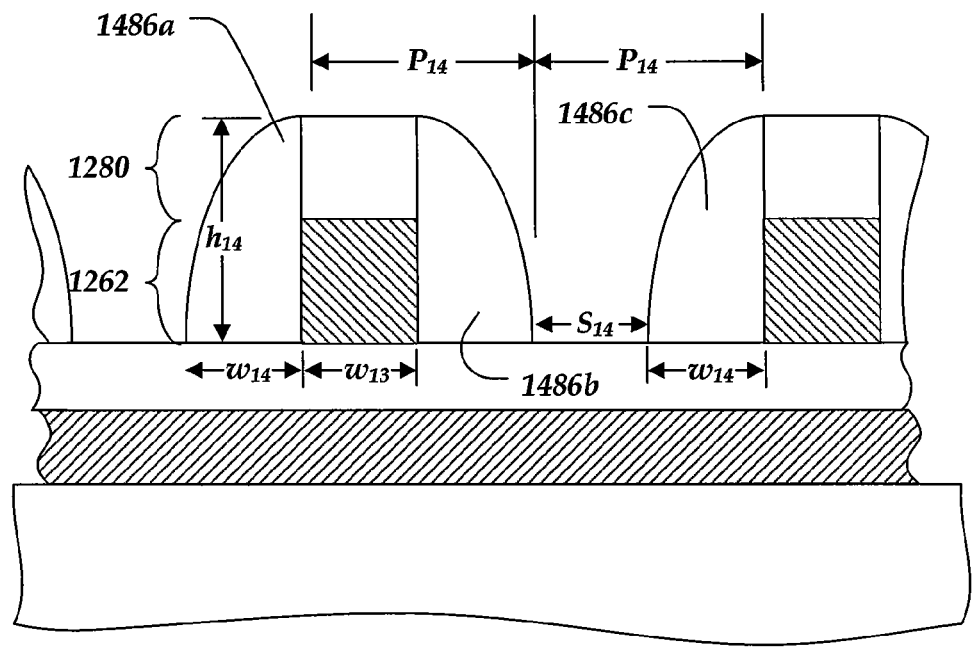

FIG. 14 is an embodiment showing a cross-sectional side view of spacers 1486a-c. Each of spacers 1486a-c has a corresponding height $h_{14}$ and a minimum width $w_{14}$. Height $h_{14}$ corresponds to a thickness of second mask layer 1262 and a thickness of photoresist mask layer 1280. In one embodiment, pitch $P_{14}$ is an embodiment of pitch $P_2$ of FIG. 2. In one embodiment, minimum width $w_{14}$ of FIG. 14 and minimum width $w_{13}$ of FIG. 13 define pitch $P_{14}$. In another embodiment, minimum width $w_{14}$ and spacing $S_{14}$ of spacers 1286a-d define pitch $P_{14}$. In one embodiment, the cross-sectional side view of FIG. 14 corresponds to processing associated with block 1173 of process 1170 of FIG. 11. In one embodiment, width $w_{14}$ and spacing $S_{14}$ have values that are in range of about 10 to 30 nm. In other embodiments, however, width $w_{14}$ and spacing S14 have values that are less than and/or greater than the values in this range. In one embodiment, height h14 has a value that is in a range of about 100 to 250 nm. In other embodiments, however, height $h_{14}$ has a value that is less than or greater than the values in this range.

Figure 15:
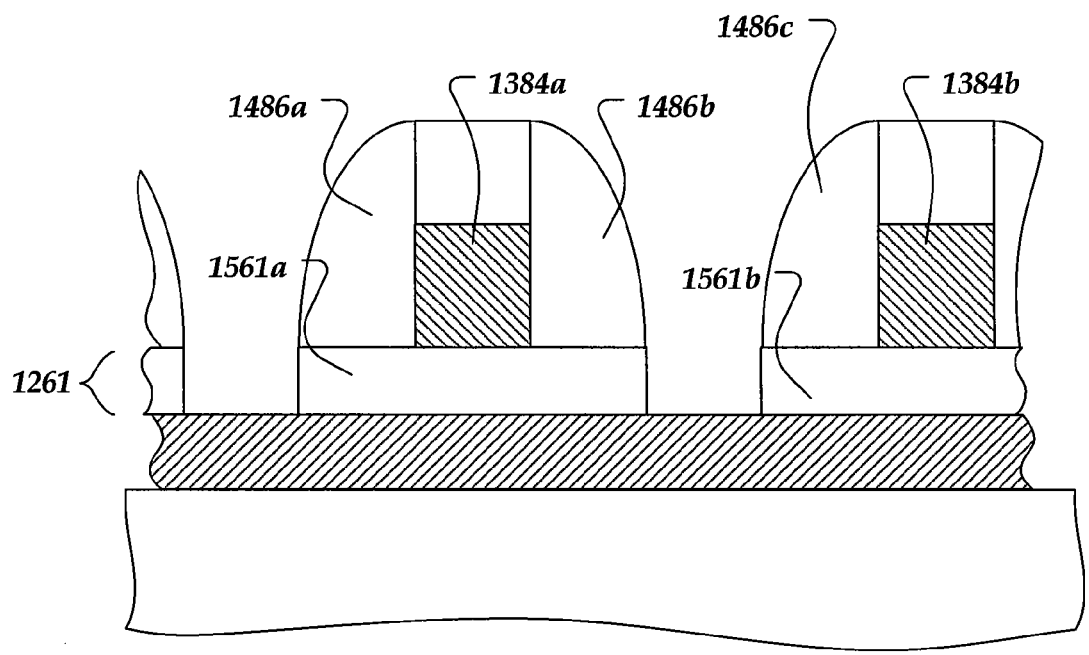

FIG. 15 is an embodiment showing a cross-section side view of features 1561a and 1561b of mask layer 1261. Patterned feature 1561a is defined by first section 1384a and spacers 1486a and 1486b. Patterned feature 1561b is defined by first section 1384b and spacer 1486c. In one embodiment, features 1561a and 1561b are an embodiment of patterned features 761a and 761b of FIG. 7, respectively. In one embodiment, the cross-sectional side view of FIG. 15 corresponds to processing associated with block 1174 of process 1170 of FIG. 11.

Figure 16:
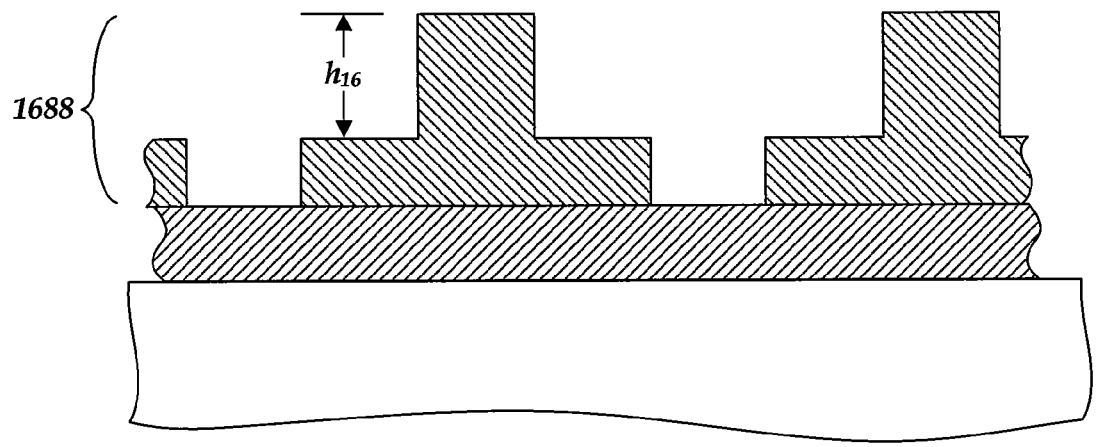

FIG. 16 is an alternative embodiment showing a cross-sectional side view of mask layer 1688. Mask layer 1688 is similar to first mask layer 1261 and second mask layer 1262 with the exception that mask layer 1688 is formed from a single microelectronic layer. For example, mask layer 1688 may be formed by employing similar processing as that carried out with respect to first mask layer 1261 and second mask layer 1262 of FIGS. 12-15; however, a timed etch may be used to define height $h_{16}$ associated with mask layer 1688 (rather than using second mask layer 1262 of FIG. 12 as an etch stop layer). In one embodiment, mask layer 1688 is polysilicon. In another embodiment, mask layer 1688 is a different microelectronic material. In one embodiment, the cross-sectional side view of FIG. 15 corresponds to processing associated with block 1174 of process 1170 of FIG. 11.

Figure 17:
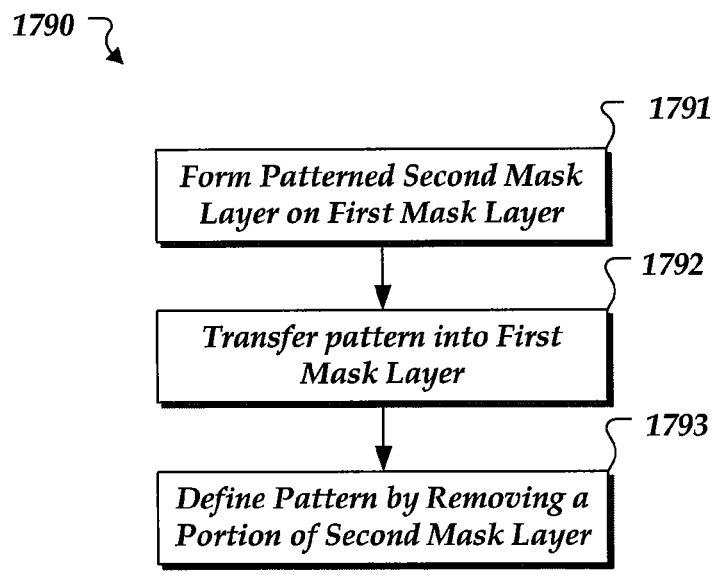
FIG. 17 is a flow diagram generally showing another embodiment of a process for self-aligned patterning one or more microelectronic layers.

FIG. 17 is a processing flow diagram generally showing an embodiment of a process for self-aligned patterning of one or more microelectronic layers. Process 1790 may be an embodiment of one or more manufacturing steps that are carried out at block 651 of process 650 of FIG. 6.

Process 1790 begins at block 1191, where a second mask layer is formed on a first mask layer. In one embodiment, a patterned photoresist mask is also formed on the second mask layer. For example, in one embodiment, a patterned photoresist mask can be formed on second mask layer 762 of FIG. 7 (prior to forming features 762a and 762b). In another embodiment, a hard mask, or the like, may be used in lieu of or in addition to a photoresist mask layer.

Processing continues to block 1792, where a pattern is transferred into the first mask layer by etching the first mask layer through the second mask layer. In one embodiment, the pattern may also be concurrently transferred into the second mask layer through a patterned photoresist mask.

Processing continues to block 1793, where another pattern in the second mask layer by removing a portion of the pattern associated with the second mask layer. In one embodiment, an anisotropic etching process may be employed to remove a portion of the pattern of the second mask layer. In one embodiment, the portion of the pattern may be removed by etching back second mask layer. In another embodiment the portion of the pattern of the second mask layer that is removed is located between a photoresist mask layer and the first mask layer. For example, if the second mask layer is a silicon oxide layer, a hydrofluoric-based wet etch chemistry may be employed to remove the portion of the pattern of the second mask layer.

Upon completion of block 1793, processing may continue. For example, in one embodiment, processing may continue to block 652 of FIG. 6.

Figure 18:
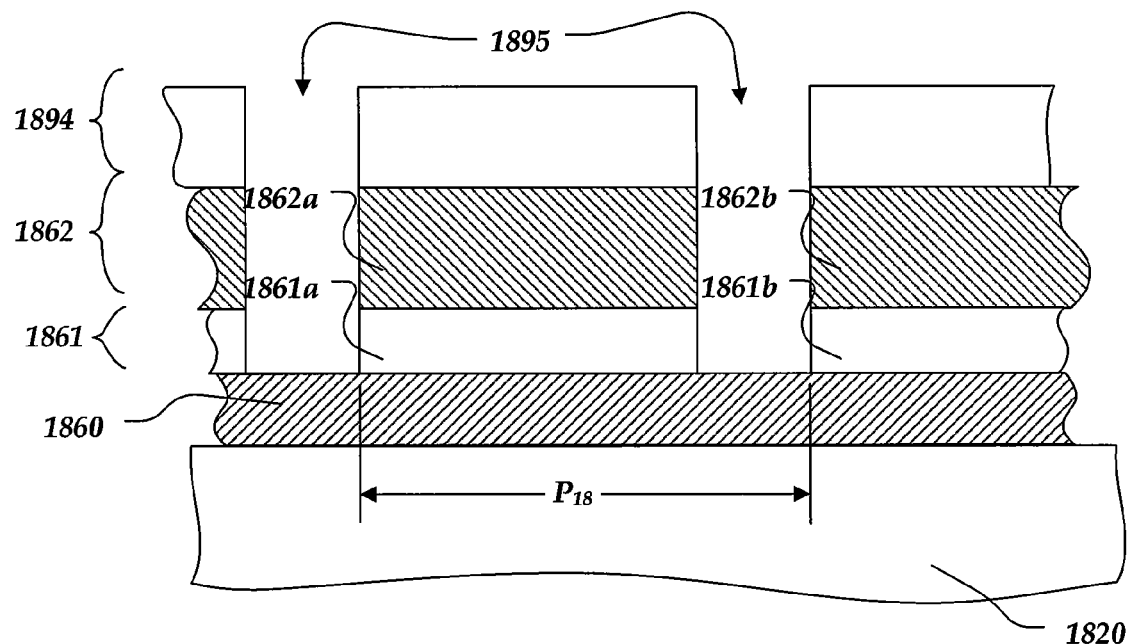
FIGS. 18-20 illustrate embodiments of stages corresponding to the process of FIG. 16.
Figure 19:
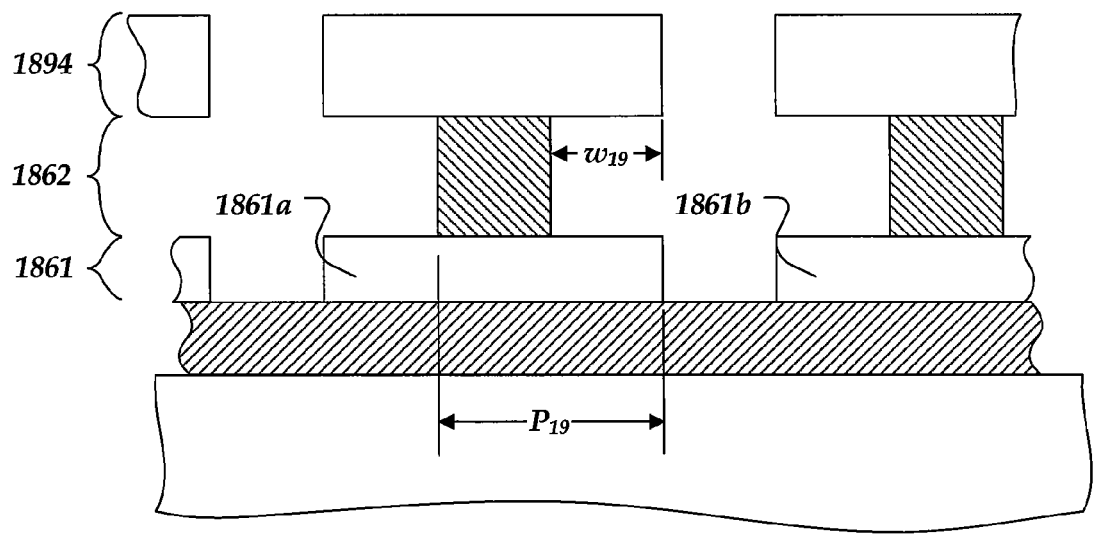
Figure 20:
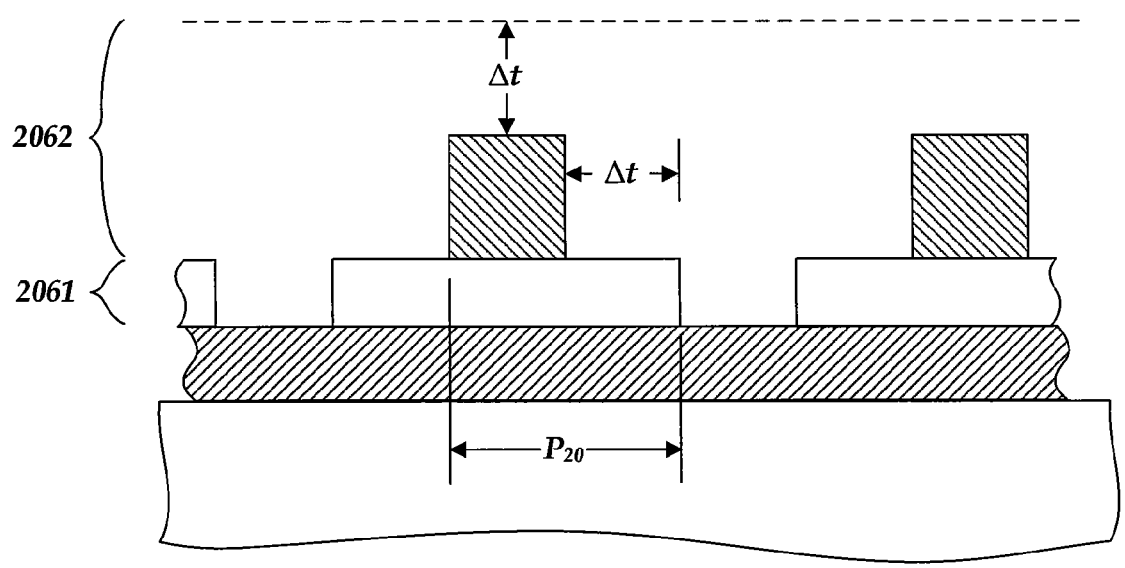

FIGS. 18-20 illustrate various embodiments of stages corresponding to the manufacture of a patterned microelectronic line or feature. In one embodiment, the various stages represent stages of manufacturing microelectronic lines 222 of FIG. 2.

FIG. 18 is an embodiment showing a cross-sectional side view of substrate 1820, microelectronic layer 1860, first mask layer 1861, second mask layer 1862, and photoresist mask layer 1894. First mask layer 1861 includes features 1861a and 1861b, second mask layer 1862 includes features 1862a and 1862b. Photoresist mask layer 1894 includes openings 1895 defining the features of the first and second mask layers. Openings 1895 also define pitch $P_{18}$. In one embodiment, substrate 1820, microelectronic layer 1860, first mask layer 1861, and second mask layer 1862 of FIG. 12 are an embodiment of substrate 720, microelectronic layer 760, first mask layer 761, and second mask layer 762 of FIG. 7, respectively. In another embodiment, pitch $P_{18}$ is an embodiment of pitch $P_7$ of FIG. 7. In one embodiment, the cross-sectional side view of FIG. 18 corresponds to processing associated with blocks 1791 and 1792 of process 1970 of FIG. 17.

FIG. 19 is an embodiment showing a cross-sectional side view of portions of second mask layer 1862 removed. Undercut width $w_{19}$, between photoresist mask layer 1894 and first mask layer 1861, can be tailored such that pitch $P_{19}$, is defined by width $w_{19}$ and the patterned portions of first mask layer 1861. In one embodiment, pitch $P_{19}$ is an embodiment of pitch $P_2$ of FIG. 2. In one embodiment, the cross-sectional side view of FIG. 19 corresponds to processing associated with block 1793 of process 1790 of FIG. 17. In one embodiment, width $w_{19}$ has a value that is in range of about 10 to 30 nm. In other embodiments, however, width $w_{19}$ has a value that is less than or greater than the values in this range.

FIG. 20 is an alternative embodiment showing a cross-sectional side view of first mask layer 2061 and portions of second mask layer 2062 removed. First mask layer 2061 and second mask layer 2062 may be similar to first mask layer 1861 and second mask layer 1862 of FIG. 19, respectively, with the exception that the top-side surface of second mask layer 2062 was not covered during an anisotropic etching process. For example, a photoresist layer was not covering second mask layer 2062 while a pattern was being transferred into first mask layer 1201. Accordingly, second mask layer 2062 has a reduced thickness Δt due to the anisotropic etching process. In one embodiment, Δt has a value that corresponds to width $w_{19}$ of FIG. 19 and Δt is tailored such that pitch P20 is defined by Δt and the patterned portions of first mask layer 2061. In one embodiment, pitch $P_{20}$ is an embodiment of pitch $P_2$ of FIG. 2. In one embodiment, the cross-sectional side view of FIG. 19 corresponds to processing associated with block 1793 of process 1790 of FIG. 17.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A method, comprising:
    forming a first mask layer and a second mask layer, the second mask layer being on the first mask layer, the first and second mask layers having first and second features, respectively;
    at least partially covering the first mask layer and the second mask layer with a film;
    forming openings in the film by removing the second feature; and
    defining a pattern in a microelectronic layer by patterning the first feature through the openings in the film, wherein forming the first mask layer and the second mask layer includes:
        defining the second feature by forming a photoresist mask layer on the second mask layer; and
        defining the first feature by forming spacers, wherein each of the spacers includes material that is on a sidewall of the second feature but not directly on top of the second feature, and wherein a height at a highest point of each spacer of the spacers is substantially equal to a combined height of the second mask layer and a photoresist mask layer.

2. The method of claim 1, wherein forming the first mask layer and the second mask layer includes defining a patterned section of the second mask layer by removing a portion of the second feature via an isotropic etching process.

3. The method of claim 1, wherein the first feature and the openings of the film define a pitch that has a value that is at least half the value of a minimum pitch of the second mask layer.

4. The method of claim 1, wherein:
    forming the first mask layer and the second mask layer includes depositing the second mask layer on the first layer,
    the first mask layer includes the microelectronic layer, and the second mask layer includes another microelectronic layer.

5. The method of claim 1, wherein forming the first mask layer and the second mask layer includes forming the first mask layer on the microelectronic layer.

6. The method of claim 1, wherein at least partially covering the first mask layer and the second mask layer with the film includes depositing a silicon oxide layer.

7. The method of claim 1, wherein defining the pattern in a microelectronic layer includes defining a pattern associated with at least one of a charge trapping component of a memory ceil, a memory word line, or a memory source gate line.

8. A method of forming a self-aligned structure, comprising:
    forming a hard mask and a patterned photoresist mask on the hard mask;
    defining combined features in the photoresist mask and the hard mask, wherein the combined features each include a first section and a second section on the first section, wherein the first section includes a portion of the hard mask and the second section includes a portion of the photoresist mask;
    forming spacers adjacent to the combined features, wherein each of the spacers is adjacent to the first section and the second section of a corresponding combined feature, wherein each of the spacers includes material that is on a sidewall of the corresponding combined feature but not directly on top of the corresponding combined feature, and wherein a height at a highest point of each spacer of the spacers is substantially equal to a height of the corresponding combined feature; and
    patterning a microelectronic layer, including:
        employing the spacers to define a first pattern in the microelectronic layer, and
        employing at least the first section of the combined features to define a second pattern in the microelectronic layer.

9. The method of claim 8, wherein each of the spacers has a first width and each first section of the combined features has a second width, and wherein patterning the microelectronic layer further includes defining a pitch of the microelectronic layer that is equal to the first width combined with the second width.

10. The method of claim 8, wherein the patterning the microelectronic layer includes:
    transferring the first pattern into the microelectronic layer by employing the spacers and the first section of the combined features as an etch mask; and
    transferring the second pattern in a film positioned on a portion of the hard mask, including:
        patterning the film by removing the first section of the combined features; and
        employing the patterned film as another etch mask.

11. The method of claim 8, wherein the microelectronic layer is one of at least two layers of the hard mask, and wherein the patterning the microelectronic layer includes:
    etching the first pattern into the microelectronic layer;
    removing the spacers from the etched microelectronic layer;
    forming a film that at least partially covers the etched microelectronic layer and the first section of the combined features;
    removing the first section of the features from the film; and
    etching the second pattern into the microelectronic layer through the patterned film.

12. The method of claim 8, wherein the forming the hard mask and the photoresist mask includes forming a first mask layer on the microelectronic layer and a second mask layer on the first mask layer, wherein each first section of each combined feature includes a portion of the second mask layer.

13. The method of claim 8, wherein the defining the combined features in the photoresist mask and the hard mask includes performing a timed etch of the hard mask.

14. The method of claim 8, wherein the defining the combined features in the photoresist mask and the hard mask includes etching the hard mask such that the etch stops at one of at least two layers of the hard mask.

15. A method of forming a self-aligned structure, comprising:
    forming a first mask layer and a second mask layer on the first mask layer;
    transferring a first pattern into the first mask layer and the second mask layer, wherein the first pattern includes a first feature;
    defining a second pattern in the second mask layer by removing a first portion of the first pattern via an isotropic etching process, wherein the first portion is associated with the second mask layer and wherein the second pattern includes a second feature; and
    transferring the first pattern and the second pattern into a microelectronic layer, wherein forming the first mask layer and the second mask layer includes:
- defining the second feature by forming a photoresist mask layer on the second mask layer; and
- defining the first feature by forming spacers, wherein each of the spacers includes material that is on a sidewall of the second feature but not directly on top of the second feature, and wherein a height at a highest point of each spacer of the spacers is substantially equal to a combined height of the second mask layer and a photoresist mask layer.

16. The method of claim 15, wherein the first pattern has, at least, a first pitch, and the microelectronic layer has, at least, a second pitch that is less than the first pitch.

17. The method of claim 15, wherein transferring the first pattern and the second pattern includes:
- forming a film that at least partially covers the first mask layer and the second mask layer; and
- defining the second pattern in the film by removing the second mask layer.

\* \* \* \* \*